(12) United States Patent
Oliver et al.

(10) Patent No.: US 6,975,023 B2
(45) Date of Patent: Dec. 13, 2005

(54) CO-PACKAGED CONTROL CIRCUIT, TRANSISTOR AND INVERTED DIODE

(75) Inventors: Stephen Oliver, Redondo Beach, CA (US); Hugh D. Richard, Meopham (GB)

(73) Assignee: International Rectifier Corporation, El Segundo, CA (US)

( * ) Notice: Subject to any disclaimer, the term of this patent is extended or adjusted under 35 U.S.C. 154(b) by 50 days.

(21) Appl. No.: 10/796,744

(22) Filed: Mar. 9, 2004

(65) Prior Publication Data

US 2004/0169262 A1     Sep. 2, 2004

Related U.S. Application Data

(63) Continuation-in-part of application No. 10/377,683, filed on Feb. 28, 2003, now Pat. No. 6,740,902.

(60) Provisional application No. 60/408,519, filed on Sep. 4, 2002.

(51) Int. Cl.[7] .............................................. H01L 23/495
(52) U.S. Cl. ...................... 257/676; 257/666; 257/678
(58) Field of Search ................................ 257/666, 676, 257/678

(56) References Cited

U.S. PATENT DOCUMENTS

| 5,874,826 A | * | 2/1999 | Chen et al. ................. 323/222 |
| 6,335,548 B1 | * | 1/2002 | Roberts et al. .............. 257/98 |
| 6,740,902 B2 | * | 5/2004 | Oliver et al. ................. 257/81 |
| 6,747,880 B2 | * | 6/2004 | Grover .................... 363/21.06 |

* cited by examiner

*Primary Examiner*—Brad Smith
*Assistant Examiner*—Douglas M. Menz
(74) *Attorney, Agent, or Firm*—Ostrolenk, Faber, Gerb & Soffen, LLP (57) ABSTRACT

A copackaged electronic device comprises a diode device having an anode coupled to a drain electrode of a switching device and a cathode capable of being coupled to an external circuit. The switching device may be controlled by an integrated circuit mounted on a source electrode of the switching device and electrically connected such that the integrated circuit is capable of controlling switching of the switching device. For example, the device is used in a power factor correction circuit. The diode device comprises at least one inverted diode having a solderable anode and a wire-bondable cathode.

16 Claims, 5 Drawing Sheets

CO-PACKAGED CONTROL CIRCUIT, TRANSISTOR AND INVERTED DIODE

RELATED APPLICATION

This application is a continuation-in-part of U.S. application Ser. No. 10/377,683 to Stephen Oliver and Hugh D. Richard, entitled "Semiconductor Package for Series-Connected Diodes," filed Feb. 28, 2003, U.S. Pat. No. 6,740,902 which claims the benefit of U.S. Provisional Application No. 60/408,519, filed Sep. 4, 2002, entitled "Tandem Diode Package with One Flip Chip." The disclosures of Ser. Nos. 10/377,683 and 60/408,519 are incorporated by reference herein in their entirety.

FIELD OF THE INVENTION

The field of the invention is electronic packaging of switching device. Specifically, a diode is copackaged with a power switch and control circuitry.

BACKGROUND OF THE INVENTION

Figure 1:
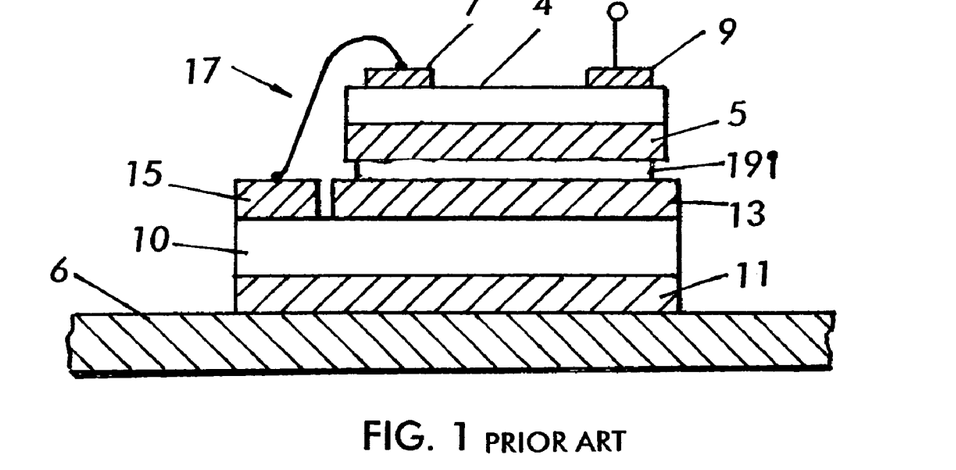
FIG. 1 shows an integrated circuit mounted on a switching device, which is mounted on a pad (partially shown).

As shown in FIG. 1, a combined chip, consisting essentially of a power switch 10, such as a MOSFET, and an integrated circuit control chip 4 mounted directly on a source electrode 13 of the power switch 10 by an adhesive 191, is known. In the example shown in FIG. 1, the adhesive 191 is an electrically conductive adhesive that also serves to couple the bottom electrode 5 of the control chip 4 directly to the source electrode 13 of the power switch 10. Alternatively, it is known to use an adhesive 191 that is electrically insulating, repositioning the electrode 5 to the same surface of the control chip 4 as the other electrodes 7, 9. Then, the electrode 5 must be electrically coupled to the source electrode 13 by any conventional process, such as by a wire bonding process. Such a combined chip may be packaged by surface mounting the drain electrode 11 of the MOSFET 10 on a printed circuit board 6 (a contact pad of which is partially shown), electrically connecting the drain of the MOSFET 10 to other electronic components by wire traces, for instance. However, a disadvantage of mounting a conventional combined chip directly to a PCB is that thermal management of the power switch 10 is limited by the presence of the PCB adjacent to the combined chip.

Also, conventional power factor correction circuits connect a separately packaged power switch with a separately packaged diode, such that the drain electrode of the power switch, such as a MOSFET 10, is electrically connected to the anode of the diode. However, such an architecture requires inventory and supply management, thermal management and electrical contacts for each of the separately packaged power devices, as both the power switch and the diode produce heat. Also, separately packaging the components and integrating the components in an electronic circuit requires a substantial amount of space for making electrical connections between the separately packaged component parts.

In addition, a conventional diode die is configured to have a wire bondable anode electrode on one side of the diode die and a solderable cathode electrode on the opposite side of the diode die. The anode electrode is wire bonded to one pin of a lead frame. The cathode electrode, which is solderable, is soldered to a copper pad of the lead frame, and the copper pad is electrically connected to another pin of the lead frame. Then, the pad, the diode die and a portion of the pins are packaged by encapsulation, such as in an epoxy resin encapsulant, to protect the diode die, allowing the packaged diode die to be connected to an external electronic circuit, such as a printed circuit board (PCB).

SUMMARY OF THE INVENTION

A diode, a power switching device and an integrated circuit controller for the power switching device are copackaged in a discrete electronic package. For example, the copackaged electronic device may be used to replace a plurality of discrete elements of a conventional alternating current (AC) to direct current (DC) converter using power factor correction (PFC).

In one embodiment, the copackaged electronic device comprises an encapsulated, discrete device, including a lead frame, a power switching device, an integrated circuit controller for switching of the gate electrode of the power switching device and a diode. The lead frame has a pad having an electrically conducting mounting surface and a plurality of leads for connecting to an external circuit, such as an AC to DC converter. The power switching device, such as a MOSFET, has a first electrode (e.g. drain) on a first surface and two additional electrodes (e.g. source and gate) on an opposite surface. The first surface is mounted on the mounting surface of the pad. The integrated circuit (IC) controller is mounted on one of the two additional electrodes and may be operably electrically coupled to the two additional electrodes by any conventional process, such as soldering and/or wire bonding, for controlling switching of the power switching device. The diode may be a flip chip and may have its anode electrode electrically mounted to the mounting surface of the pad. For example, the diode is laterally removed from the power switching device in a side-by-side arrangement. Leads of the lead frame are electrically coupled to the pad, the cathode of the diode, control electrodes of the IC controller and at least one of the additional electrodes of the power switching device, such that the copackaged electronic device may be operably connected to an external circuit.

In one example, a copackaged electronic device is packaged in a power package, such as a TO220, D2pak, TO220FP or TO247, while including the control circuit and the power switching device together with the diode. The number of discrete parts, the number of individual connectors, and the number of wire bonds or wire traces between components are reduced compared to conventional use of discrete components of an AC to DC converter with power factor correction. For example, a through hole lead frame package may be mounted directly to a heat sink via an exposed back surface of the lead frame pad, greatly improving and simplifying thermal management of the heat generating power switching device and diode.

In one embodiment of the present invention, an integrated, electronic package has a plurality of diodes in series electrical contact mounted on an insulating layer on a portion of an electrically conductive contact pad. Optionally, a common heat sink may be mounted to the opposite side of the lead frame providing thermal management of each of the heat-generating power devices. One diode may be a conventional diode with an anode of a wire bondable material, such as an aluminum, and a cathode of a solderable material, such as a solderable metal, e.g. a copper including, without limitation, solderable copper alloys. The solderable cathode may be joined to the electrically conductive contact pad by a thin layer of solder between the cathode and the lead frame, for example. The other diode may be an inverted diode. An inverted diode comprises a cathode of a wire bondable material and a solderable anode and, otherwise, may have a common semiconductor die architecture with the conventional diode. For example, the two diodes are copacked with an integrated circuit controller and/or a power switching device.

In one embodiment, a passivation layer surrounds the anode of the inverted diode. The passivation layer protects the termination structure of the inverted diode, allowing the anode to be directly joined to the electrically conductive surface of a die pad. The passivation layer electrically insulates the termination structure from the conductive lead frame.

One advantage of the copackaged device is that the size of a power factor correction circuit is reduced. Another advantage is that fewer wire bonds are required, reducing circuit resistance and inductance. Yet another advantage is that the number of external leads for connecting to a circuit board, such as a PCB, is reduced compared to a conventionally mounted transistor, integrated circuit controller and diode. Yet another advantage is that thermal management of the heat generating components is simplified and improved by copackaging the power switching device and the diode.

Other features and advantages of the present invention will become apparent from the following description of the invention which refers to the accompanying drawings.

DETAILED DESCRIPTION OF THE PREFERRED EMBODIMENTS

Figure 2:
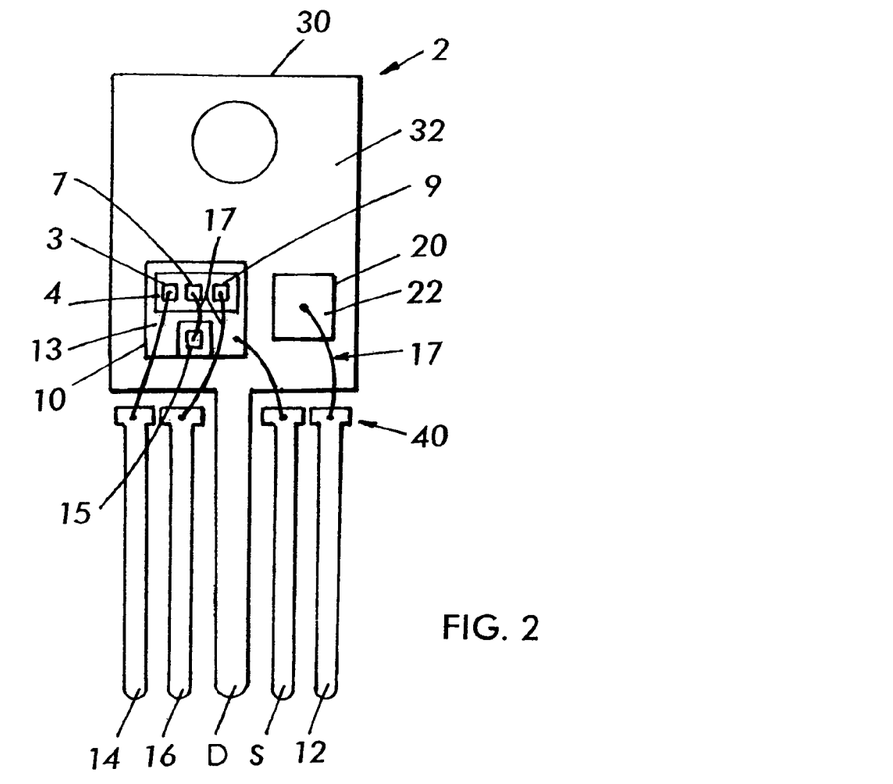
FIG. 2 shows an embodiment of the present invention.

Now referring to FIG. 2, one embodiment of a copackaged electronic device 2 comprises a single, 600 Volt (V) fast recovery diode 20 electrically connected to the drain electrode 11 of a MOSFET 10 via an electrically conductive pad 32 of a lead frame 30. The diode 20 is laterally removed from the MOSFET 10 on the mounting surface of the pad 32 and the anode electrode 24 of the diode 20 is electrically mounted on the mounting surface of the pad 32. For example, the diode 20 may be a flip chip diode (e.g. inverted), having the cathode electrode 24 of the diode 20 wire bonded 17 to a lead 12 of the lead frame 30. For example, a contact pad 40 electrically couples a wire bond 17 to the lead 12. Flip chip mounting of the diode 20 greatly simplifies the assembly process and reduces the number of wire bonds required, which reduces wire bond resistance and inductance, improving the efficiency of the discrete copackaged electronic device 2 of FIG. 2 compared to devices using a conventional diode.

Figure 3:
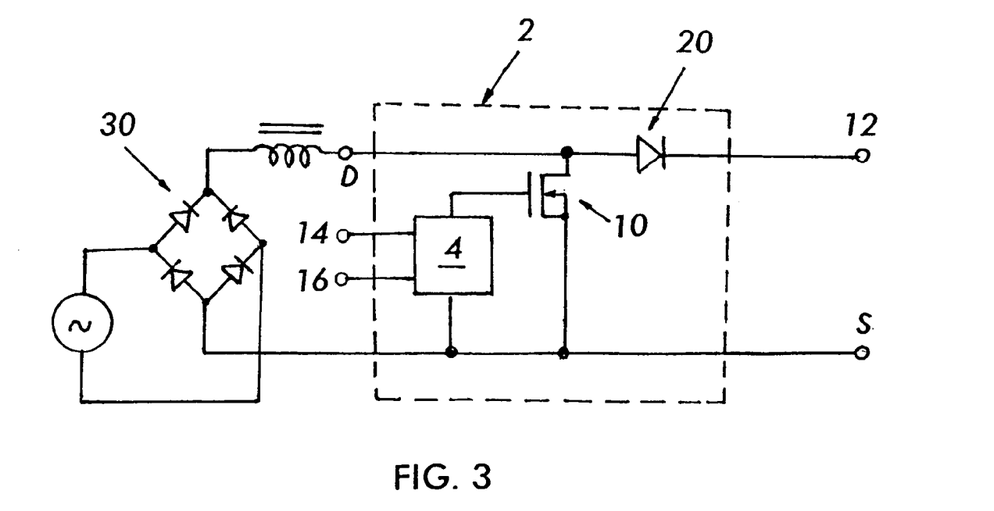
FIG. 3 shows a circuit diagram of the embodiment shown in FIG. 2.

In one embodiment, an integrated circuit 4 (IC) is mounted on the source electrode 13 of the MOSFET 10 by a layer of electrically conductive adhesive 19, such as solder, an adhesive tape or an epoxy, and is electrically coupled to an electrode 5 on the bottom of the IC 4 to the source electrode 13. Alternatively, the IC 4 may have all of its electrical contacts 5, 7, 9 on the same major surface, the layer of adhesive may be electrically insulating, and electrode 5 may be electrically coupled to the source electrode 13 by any conventional process, such as by a wire bond. For example, FIG. 1 shows an electrical contact 7 on the IC 4 that is electrically coupled by a conventional wire bond 17 to the gate electrode 15 that is used for controlling the switching of the MOSFET 10. The IC 4 is also electrically coupled to the control leads 14, 16 of the lead frame 30, as shown in FIG. 2, for example. As shown in FIG. 3, the leads 14, 16 provide for coupling of the IC 4 to a power factor correction circuit 30, which provides electrical signals or voltages to the IC 4, as is known in the art of power electronics.

The mounting surface 33 of the pad 32 of the lead frame 30 may be made of any electrically conductive material, such as a homogenous metal layer. For example, the entire pad 32 is a metal, such as a copper or an aluminum metal, which improves thermal heat transfer through the pad 32. In one example, the copackaged electronic device 2 is packaged using an encapsulant (not shown), such as an epoxy resin, to encapsulate the electronic components, but leaving the back surface 35 of the pad 32 exposed, allowing a heat sink (not shown) to be directly coupled to the pad 32. Thus, thermal management of the heat generating components, the MOSFET 10 and the diode 20, is greatly simplified compared to the thermal management required for use of conventional discrete components.

The wire bonds 17 may be made by any conventional process, such as a conventional wire bonding process using gold or an aluminum. The anode electrode 24 of the diode 20 is electrically coupled to the pad 32 of the lead frame 30. For example, an electrically conductive adhesive 19, such as a solder, an adhesive tape or a continuous, metal-filled epoxy, may be used to electrically couple the electrode 11 of the MOSFET 10 and the anode electrode 24 of diode 20 to the mounting surface 33 of the pad 32 of the lead frame 30. Preferably, the anode electrode 24 of the diode 20 is solderable, and the thermal resistance of the pad 32, the anode electrode 24 and the layer of solder 19 is reduced, allowing efficient heat removal from the diode 32.

Figure 4A:
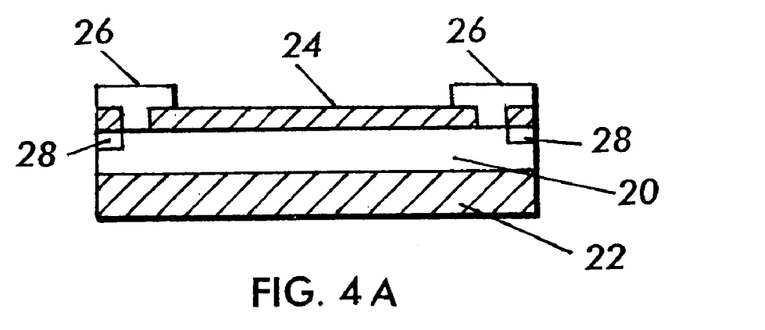
FIG. 4A shows a cross-section inverted diode having a solderable anode surrounded by a passivation layer, according to the present invention.
Figure 4B:
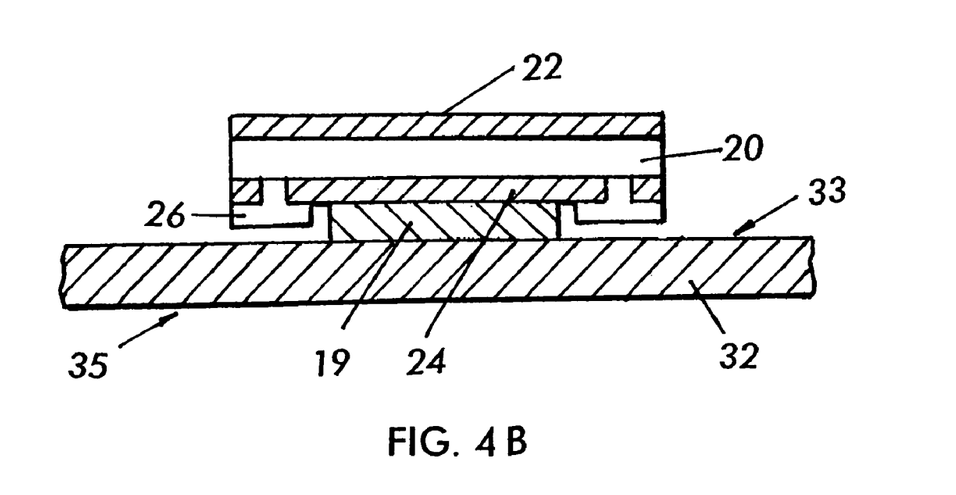
FIG. 4B shows the cross-section of the inverted diode of FIG. 4A, mounted on a pad (partially shown).

In one embodiment, a copackaged device 2 is fabricated by manufacturing a conventional MOSFET 10 and a flip chip diode 20, such that the cathode 22 of the diode 20 is made of an aluminum, and the anode electrode 24 is made for joining to the mounting surface 33 of the pad 32 of the lead frame 30. Preferably, the anode electrode 24 is made of a solderable metal, such as copper or a copper alloy, and the anode electrode 24 is surrounded by a passivation layer 26, which may be made of an insulating epoxy, for example. The passivation layer 26 shields the termination structure 28. For example, during joining of the anode electrode 24 to the lead frame pad 32, the passivation layer 26 shields the termination structure 28 from contacting solder 2 or electrically conductive adhesive 2.

In one embodiment, both the drain 11 of the MOSFET 10 and the anode electrode 24 of the diode 20 are mounted on the same surface 33 of the pad 32 of the lead frame 30 in a side-by-side configuration, allowing the back side 35 of the pad 32 to remain exposed after the electronic devices 4, 10, 20 are encapsulated by an encapsulant. The IC 4 may be mounted on the MOSFET 10 either after the MOSFET 10 is mounted on the pad 32 or prior to mounting the MOSFET 10 on the pad 32. In one embodiment, the IC 4 is mounted on the MOSFET 10, and then both the MOSFET 10 and the diode 20 are joined to the pad 32 simultaneously in a common soldering step.

For example, contacts 3, 7, 9 on the surface of the IC 4 are then wire bonded to the gate electrode 15 of the MOSFET 10 and to external leads 14, 16, as shown in FIG. 2. Input leads 14, 16 may be connected to an external circuit board (not shown) to provide voltage signals for the IC 4 to control the switching of the MOSFET. Output lead 12 outputs the resulting output voltage of the copackaged device, and the source lead S and drain lead D are used as external connections to the source and drain electrodes S, 11 of the MOSFET 10. Other configurations of contacts and leads may be used to integrate the copackaged device in a power factor correction circuit, for example, as is known in the art.

Preferably, by copackaging the IC 4, MOSFET 10 and diode 20 as described, the copackaged device 2 is capable of being housed in a device having the same form as a conventional diode package, such as a D2-pak, TO220 or TO247. For example, a 5-pin TO220 standard configuration may be fabricated by enclosing the IC 4, MOSFET 10 and diode 20, as shown in FIG. 2 within a resinous encapsulant. Preferably, the back surface 35 of the pad 32 remains exposed for mounting a heat sink (not shown) to the pad 32, enhancing heat transfer by limiting the thermal resistance between the heat generating components 10, 20 and the heat sink. Copackaging of these heat-generating power devices 10, 20 simplifies thermal management by using a common heat sink, for example. Alternatively, a 6-pin or 7-pin package may be used, offering additional output pins for connecting with an external electrical circuit.

Figure 5:
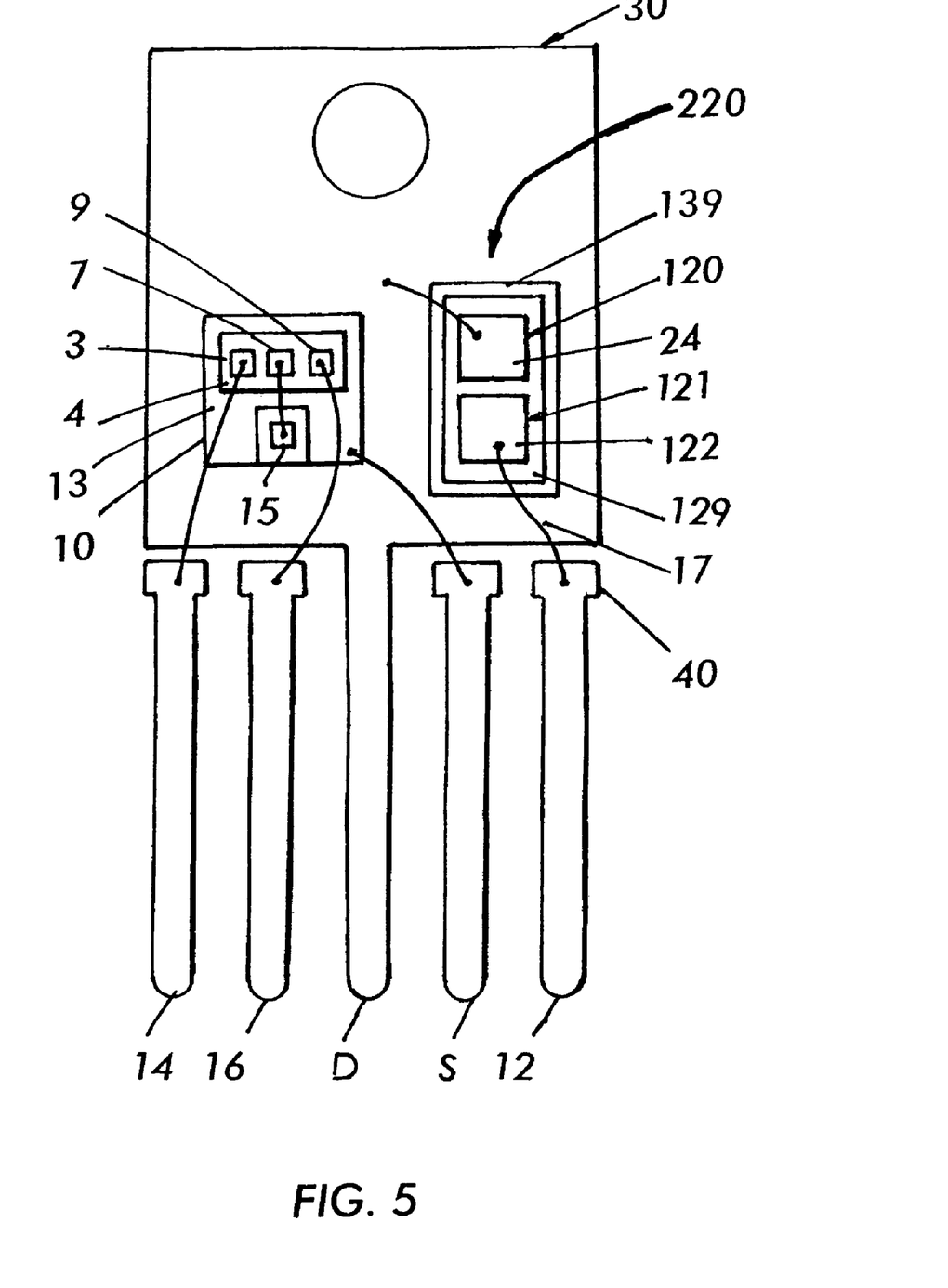
FIG. 5 shows another embodiment of the present invention.

As shown in FIG. 5, two 300 V diodes 120, 121 are connected in series in a tandem diode package 220, creating a single 600 V fast diode for continuous mode power factor correction. As shown in FIG. 5, a tandem diode circuit 220 comprises a first diode 120, an inverted diode 121, a diode contact pad 129, a pin contact pad 40 and an electrical lead 12. One diode 120 is wire bonded from its anode 24 to a mounting surface of a conductive die pad 30. The die pad 30 is integrally attached to a central pin D. An inverted diode 121 has a cathode 122 that is wire bonded to a pin contact pad 40. The contact pad 40 is integrally attached to an electrical lead D. Alternatively, lead D may be separated from contact pad 40, and the contact pad 40 may be coupled to the lead D by any conventional process, such as wire bonding. Thus, pin D is electrically coupled to the anode 24 of one diode 120 and lead 12 is electrically coupled to the cathode 122 of the tandem diode package 220, such that the tandem diode package 220 may be connected in a circuit with the copackaged MOSFET 10 and IC 4.

The contact pad 129 may be made of any electrically conductive material. Preferably, the contact pad 129 is a metal, such as a copper or an aluminum metal and is insulated from the mounting surface 33 of the lead frame 30 by an insulating layer 139, such as an insulating adhesive layer or ceramic layer. Wire bonding may be completed by any conventional process, such as a conventional wire bonding process using gold wires. Each of the diodes 120, 121 are electrically bonded to the contact pad 129. For example, a solder or conductive adhesive, such as a continuous, metal-filled epoxy, may be used to make an electrical connection between the cathode of the first diode 120 and the anode 122 of the inverted diode 121 via the contact pad 129.

Figure 6A:
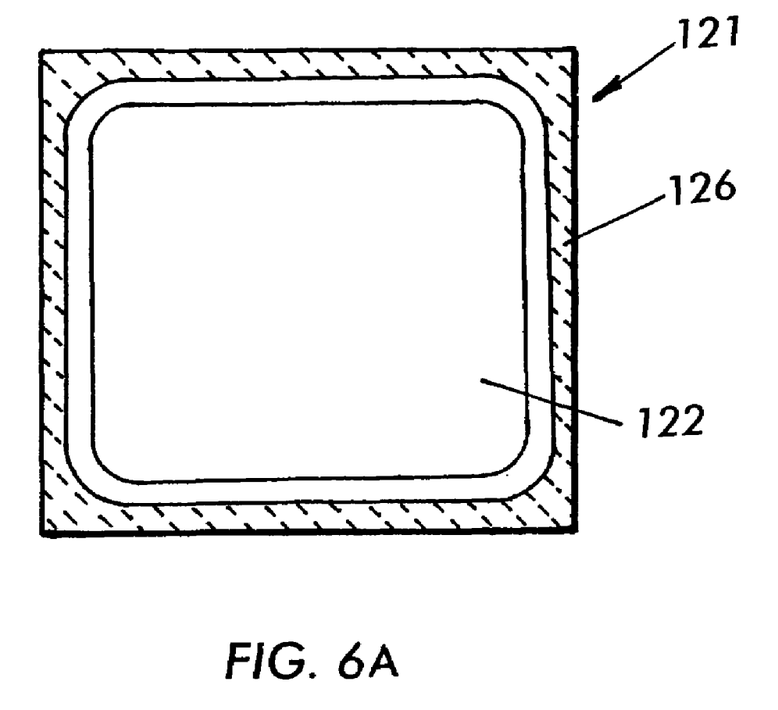
FIGS. 6A and 6B illustrate a diode with a passivation layer.
Figure 6B:
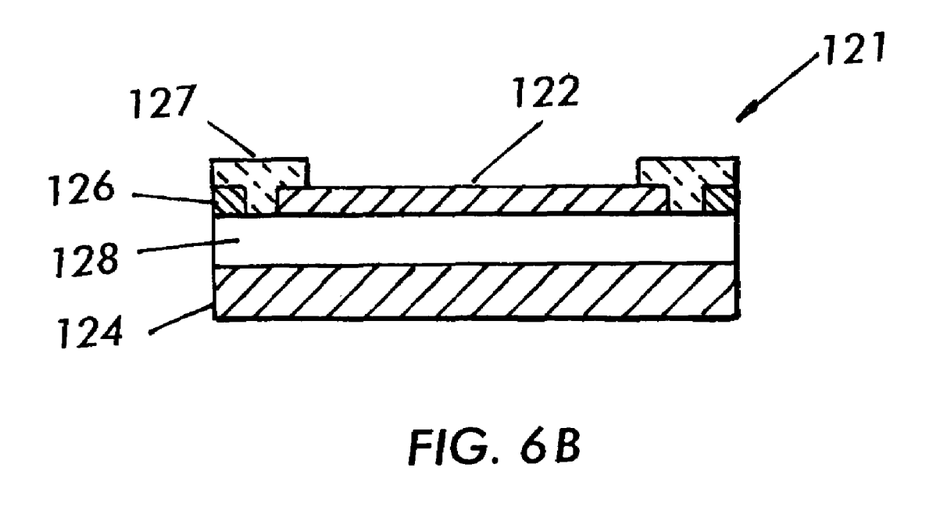

In one embodiment, the tandem diode package 220 is fabricated by manufacturing one conventional diode 120 and one inverted diode 121. The conventional diode 120 may be prepared by any conventional process. The semiconductor die 128 of inverted diode 121 may be made by the same process; however, the cathode 124 is made of a material for wire bonding between the cathode 124 and the contact pad 40, and the anode 122 is made for joining to the tandem diode contact pad 129. Preferably, the cathode 124 is of an aluminum, such as a wire bondable aluminum alloy. Preferably, the anode 122 is made of a metal and is surrounded by a passivation layer 127, which may be made of an insulating epoxy, for example. The passivation layer 127 protects the termination structure 126, during joining of the anode 122 to the tandem diode contact pad 129, from contacting the electrically conductive material adhering the anode 122 to the contact pad 129. More preferably, the metal of the anode 122 of the inverted diode 121 is of a solderable metal.

For example, both semiconductor diode dies 128 may be made on the same wafer by applying and patterning anodes, cathodes, termination structures and passivation layers as appropriate on the anode and cathode sides of each semiconductor device. The semiconductor diode dies are then separated, such as by sawing or laser cutting the dies from the wafer. The conventional diode 120 has its cathode 22 soldered to the contact pad 129, and the inverted diode 121 has its anode 122 soldered to the contact pad 129. Preferably, both of the diodes 120, 121 are mounted on the same surface of the lead frame 30 in the same die bonding step. Then, both diodes 120, 121 are wire bonded to their respective wire bonding points. Packaging of the tandem diode structure 220 is then completed as previously addressed. Alternatively, the tandem diodes 120, 121 may be mounted first on a tandem diode contact pad 139, and then the contact pad may be mounted on the lead frame 30 prior to wire bonding of the diode electrodes.

A plurality of diodes 120, 121 may be connected in series by this process, forming a very fast, high voltage diode package. At high voltages, a tandem diode package 220 has a faster reverse recovery time than a single diode of the same rating. For example, two fast diodes 120, 121 connected in series on a single contact pad 139 may be housed in a standard power diode package, such as a TP220, D2-pak, TO220FP or TO247, without any need of internal insulation. For example, parallel pins 144, 146, 148 extend from one side of the lead frame 130 as shown in FIGS. 7A.

Figure 7A:
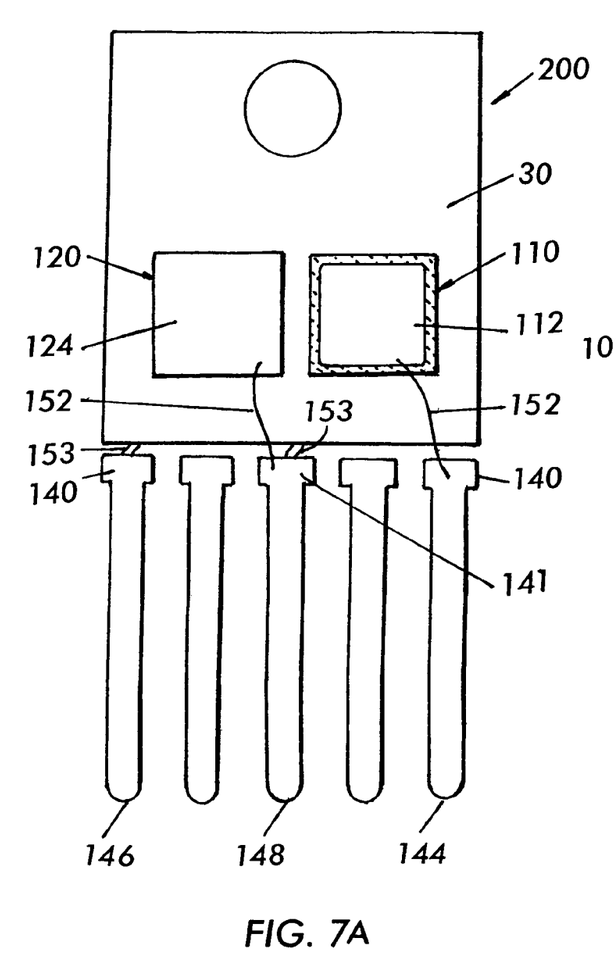
FIG. 7A illustrates use of diodes of FIGS. 6A and 6B in the embodiment of FIG. 5.
Figure 7B:
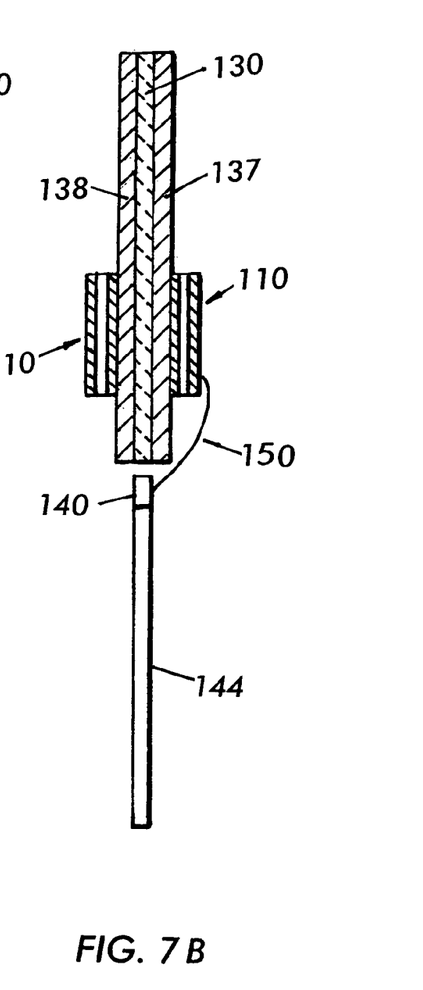
FIG. 7B illustrates diodes mounted on opposite sides of a die pad in another embodiment of the present invention.

As shown in FIGS. 7A and 7B, tandem diodes 120, 121 may be packaged in series by placing two identical lead frames 30 back-to-back and separated by an insulating layer 130. For example, the tandem diodes 120, 121 are then mounted on one surface and wire bonded to contact pads 140, 141, which may be wire bonded to electronic devices on the opposite surface of the lead frame 30 by wire bonds 153 as shown in FIG. 7A. In this example, the surface of the lead frame 30 serves as a contact pad 139, such that the tandem diodes 120, 121 are connected in series.

For example, the lead frame 30 may comprise a composite structure having an electrically conducting top surface 137 and an electrically conducting bottom surface 138 separated by an electrically insulating layer 130 sandwiched between the top surface and the bottom surface. For example, the electrically insulating layer 130 may be a thermally conductive layer of a phase change sheet, a tape, an epoxy, a dielectric coating, a boron nitride layer, a silicone grease or a silicone/boron nitride composite.

In one embodiment, the lead frame 30 has a plurality of diodes, including at least one inverted diode with a passivation layer around the anode, mounted in series on only one surface of the lead frame 30. The opposite surface of the lead frame 30 may be exposed for dissipation of heat. For example, the opposite surface thermally connects to a heat sink (not shown), which extracts heat from the diode package efficiently. In this alternative embodiment, the MOSFET 10 and IC 4 may be copackaged in a separate, discrete package that is mounted on the same heat sink as the diode package. For example, the two discrete electronic packages may be mounted side-by-side or on opposite sides of a common heat sink.

Although the present invention has been described in relation to particular embodiments thereof, many other variations and modifications and other uses will become apparent to those skilled in the art. It is preferred, therefore, that the present invention be limited not by the examples herein, but only by the claims themselves.

What is claimed is:

1. A copackaged device containing a plurality of electronic devices defining at least a portion of a circuit, and comprising:
    a lead frame having a pad and a plurality of leads extending away from the pad, at least one of the plurality of leads being electrically connected to the pad, the pad having a mounting surface and a bottom surface opposite of the mounting surface, the mounting surface being electrically conductive;
    a power switching device comprising a semiconductor die, a first electrode on a first surface of the die, and a second electrode and a third electrode on an opposite surface of the die, the first electrode being mounted and electrically connected to the mounting surface of the pad of the lead frame;
    an integrated circuit having logic circuitry for controlling the power switching device, the integrated circuit being mounted on the opposite surface of the die of the power switching device and being operably electrically coupled to the power switching device such that the integrated circuit is capable of controlling the switching of the integrated circuit in response to signals received from the circuit;
    a diode die having a cathode electrode on a first surface and an anode electrode on a second surface opposite of the first surface, wherein the cathode is wire bondable and the anode electrode is mounted and electrically connected to the mounting surface of the pad of the lead frame such that the diode die is laterally removed from the power switching device and is electrically coupled to the first electrode of the power switching device.

2. The device of claim 1, wherein the bottom surface of the pad of the lead frame is exposed, such that the bottom surface is configured to mount a heat sink operable for direct thermal heat transfer from the pad of the lead frame.

3. The device of claim 1, wherein the cathode electrode of the diode die is of an aluminum.

4. The device of claim 3, wherein the diode die includes a termination structure at least partially surrounding the anode electrode and the diode die has a passivation layer at least partially surrounding the anode, such that the passivation layer shields the termination structure of the diode die.

5. The device of claim 1, wherein the circuit is a power factor correction circuit.

6. The device of claim 2, wherein the circuit is a power factor correction circuit.

7. The device of claim 3, wherein the circuit is a power factor correction circuit.

8. The device of claim 4, wherein the circuit is a power factor correction circuit.

9. The device of claim 5, wherein the plurality of leads consists of five leads and the five leads extend from one edge of the pad and a first lead and a second lead of the five leads are wire bonded to contacts disposed on the opposite surface of the integrated circuit, a third lead of the five leads is integrally attached to the pad, the fourth lead is wire bonded to one of the second electrode and the third electrode of the power switching device and the fifth lead of the five leads is wire bonded to the cathode electrode of the diode die.

10. A copackaged device for connection to an external circuit, comprising:
    a lead frame having a pad and a plurality of leads extending in a direction away from the pad, at least one of the plurality of leads being electrically connected to the pad, the pad having a mounting surface and a bottom surface opposite of the mounting surface, the mounting surface being electrically conductive;
    a power switching device comprising a semiconductor die, a first electrode on a first surface of the die, and a second electrode and a third electrode on an opposite surface of the die, the first electrode being mounted and electrically connected to the mounting surface of the pad of the lead frame;
    an integrated circuit having logic circuitry for controlling the power switching device, the integrated circuit being mounted on the opposite surface of the die of the power switching device and being operably electrically coupled to the power switching device such that the integrated circuit is capable of controlling the switching of the integrated circuit in response to signals received from the external circuit; and
    a diode package comprising a first diode die having a first anode and a first cathode, a second diode die having a second anode and a second cathode, and a diode contact pad mounted on the lead frame by an insulating layer, wherein the second anode is mounted on and electrically coupled to the diode contact pad and the first cathode is mounted on and electrically coupled to the diode contact pad such that the first diode and the second diode are mounted side by side and electrically connected in series by the diode contact pad, the first anode being electrically coupled to the first electrode of the power switching device and the second cathode being electrically coupled to one of the plurality of leads such that the integrated circuit, the power transformer and the diode package define a portion of an electrical circuit.

11. The device of claim 14, wherein the second anode is of a solderable aluminum and the second cathode is of a wire-bondable copper, wherein the second anode is coupled to the diode contact pad by a solder layer and second cathode is coupled to the one of the plurality of leads by at least one wire bond.

12. The device of claim 11, wherein the insulating layer is sandwiched between the lead frame and the diode contact pad such that no electrical contact is made between the diode contact pad and the lead frame.

13. The device of claim 12, wherein the insulating layer is mounted on the mounting surface of the lead frame.

14. The device of claim 12, wherein the insulating layer is mounted on the bottom surface of the lead frame.

15. The device of claim 11, wherein the mounting surface is electrically coupled by a wire bond to a pin contact pad of one of the plurality of leads and the first anode of the first diode is electrically coupled by another wire bond to a pin contact pad of one of the plurality of leads such that the power switching device is operably coupled to the first anode during operation of the device.

16. The device of claim 15, wherein the pin contact pad coupled to the first anode of the first diode is a different pin contact pad than the pin contact pad coupled to the mounting surface, such that the power switching device is operably coupled to the first anode of the first diode by the external circuit during operation of the device.

* * * * *